United States Patent [19]

Katayama et al.

[11] Patent Number: 5,262,614

[45] Date of Patent: Nov. 16, 1993

[54] CIRCUIT BOARD AND SEALING STRUCTURE AND METHODS FOR MANUFACTURING THE SAME

[75] Inventors: Kaoru Katayama; Hidetaka Shigi, both of Hadano, Japan

[73] Assignee: Hitachi, Ltd., Tokyo, Japan

[21] Appl. No.: 714,373

[22] Filed: May 31, 1991

[30] Foreign Application Priority Data

May 31, 1990 [JP] Japan .................................. 2-142456

[51] Int. Cl.⁵ ........................ B23K 26/02; B23K 26/08
[52] U.S. Cl. ............................ 219/121.69; 219/121.82; 219/121.83
[58] Field of Search ....................... 219/121.68, 121.69; 156/643; 427/53.1

[56] References Cited

U.S. PATENT DOCUMENTS

| | | | |
|---|---|---|---|
| 4,630,491 | 12/1986 | Kitagawa et al. | 219/121.69 X |
| 4,874,920 | 10/1989 | Yamazaki et al. | 219/121.85 |
| 4,928,838 | 5/1990 | Imamura | 219/121.69 |
| 5,008,582 | 4/1991 | Tanuma et al. | 310/332 |

FOREIGN PATENT DOCUMENTS 62-145797  6/1987  Japan .

OTHER PUBLICATIONS

Thomas A. Znotins et al. "Excimer Laser: An Emerging Technology in Materials Processing", Laser Focus/Electro-Optics, pp. 54, 56 58, 60 and 63, May 1987.
Proceedings of the 3rd European Conference on Laser Treatment of Materials, Sep. 1990 vol. pp. 825-834.

*Primary Examiner*—C. L. Albritton
*Attorney, Agent, or Firm*—Fay, Sharpe, Beall, Fagan, Minnich & McKee

[57] ABSTRACT

A circuit board is manufactured by a method having the steps of depositing a metal pattern on a ceramic board, depositing a thin layer of a high polymer material on the ceramic board formed with the metal pattern, depositing a protective layer of a high polymer material on the thin layer of the high polymer material, and directing a laser beam toward and onto the protective layer and the thin layer deposited on a plating region of the metal pattern and a cutting region of the ceramic board thereby selectively removing part of those layers. The laser beam has a wavelength range of from 150 nm to 400 nm, an energy density range of from 0.5 J/cm² to 5.0 J/cm², and a pulse width range of from 100 ps to 1 μs.

16 Claims, 4 Drawing Sheets

CIRCUIT BOARD AND SEALING STRUCTURE AND METHODS FOR MANUFACTURING THE SAME

BACKGROUND OF THE INVENTION

This invention relates to a circuit board and a sealing structure, and more particularly to a technique which is effectively applicable to selective removal and cleaning of a layer of a material such as a high polymer material or an organic material in a circuit board or a sealing structure.

It is known that, in a ceramic circuit board or the like used for mounting or sealing a semiconductor integrated circuit element, a thin film or layer of, for example, a high polymer material such as a polyimide resin is used for inter-layer insulation in a multilayer interconnection wiring arrangement provided on the circuit board or used as a protective film or layer for such a multilayer interconnection wiring arrangement.

This thin layer of the high polymer material such as polyimide is formed by coating the material in liquid form on the entire surface of the board by means such as spin-coating and then thermally setting or hardening the coating. Therefore, it becomes necessary to selectively remove, prior to the later step of soldering or plating, the polyimide layer where it covers, for example, a metallized pattern formed in an external connection terminal region of the interconnection wiring arrangement or a metallized pattern formed in a region where the package is sealed by a cap.

Hitherto, etching, for example has been dry etching commonly employed in the art as a means for selectively removing such a layer of a high polymer material.

According to this dry etching, plasma of, for example, oxygen gas is directed toward and onto the entire surface of a ceramic board where such a thin layer of a high polymer material is masked by, for example, a mask of a metal material, so as to selectively etch the thin layer of the high polymer material by bombardment with ions or electrons.

Another method is disclosed in, for example, JP-A-62-145797. According to this disclosed method, a polyester film covering a copper foil pattern deposited on a flexible circuit board is selectively removed by irradiating the film with an ultraviolet laser beam so as to externally expose a region such as an external terminal region of the copper foil pattern.

SUMMARY OF THE INVENTION

However, in the former method of dry etching, the surface of the metal mask (for example, a mask of aluminum) selectively masking the thin layer of the high polymer material is also subjected to the etching action and is deteriorated. As a result, products of etching and/or fragments of the metal mask subjected to the etching treatment attach as foreign matter to the etched region of the thin layer of the high polymer material, and the underlying metal pattern exposed from the etched region of the thin layer of the high polymer material is inevitably contaminated and oxidized. Therefore, the method of dry etching has the problem that the plating property of the metal pattern, i.e. its capability of being plated by a metal such as gold or nickel, is inevitably degraded.

Also, to deal with the problem of contamination, oxidization, etc. occurring as a result of the dry etching, a method has been proposed in which foreign matter, an oxide film, etc. remaining on a metal pattern are mechanically or chemically removed. However, this method is also not preferable, because the surface of the metal pattern is deteriorated, and the capability of being later plated by a metal is also degraded.

Another cause giving rise to degradation of the plating property will be described. The metal pattern is formed by coating a metal paste in a predetermined pattern on a green sheet of a ceramic material by means of, for example, printing, and then baking both the green sheet and the metal paste to thermally set the metal pattern. Therefore, fine concavities and convexities are present on the surface of the baked metal pattern.

A high polymer material is then coated to cover the entire surface of the ceramic board having the metal pattern formed thereon and is then thermally set to form the thin layer of the high polymer material. Therefore, even when the thin layer of the high polymer material on the metal pattern is selectively removed by the dry etching, the high polymer material trapped in the fine concavities of the surface of the metal pattern tends to remain in these concavities. Thus, the surface of the metal pattern will not be successfully plated with the metal, and the plated metal layer tends to be easily stripped off from the surface of the metal pattern. When the dry etching is repeated so as to avoid such a trouble, the metal pattern itself will be partly etched away, and the metal pattern itself will be damaged. Therefore the metal pattern has previously been checked by human eyes for presence/absence of the residue of the high polymer material.

Further, in the case of the method of dry etching, the rate or speed of etching is relatively low, and as many as ten extra steps or more are required for the metal mask formation, removal, etc., with the result that there arises the problem that a long period of time is required for completing the process. The steps of the metal mask formation and removal have required a period of time as long as several-tens of hours.

The ceramic board is usually cut from a ceramic sheet by grinding by a rotary grinding wheel. However, when a thin layer of, for example, a high polymer material is present in a cutting region of the ceramic board, it leads to undesirable clogging of the gaps between the grains of the grinding wheel, thereby obstructing the cutting operation, and it also leads to a shortened useful service life of the grinding wheel itself. The above trouble can be avoided by removing beforehand the thin layer of the high polymer material from the cutting region by dry etching. However, the dry etching requires many steps as described above and is not practical.

On the other hand, the latter method disclosed in JP-A-62-145797 is effective in that, in the course of the step of automatic deposition of a cover film in the process for manufacturing a flexible circuit board, a region not requiring the cover tape can be accurately removed. However, JP-A-62-145797does not refer to any measure for dealing with the foreign matter produced during irradiation with the laser beam directed onto a region not requiring the cover tape and accumulating on the remaining resion. Also, it does not refer to required conditions for irradiation with the laser beam for improving the plating property of the exposed copper foil pattern.

In the case of packaging a semiconductor integrated circuit element, effective radiation of heat from the package becomes quite important. For example, a heat radiating member is brought into contact with the surface of the package in which a sealing cap of, for example, a ceramic material is bonded to the ceramic board on which the semiconductor integrated circuit element is mounted, so that heat can be radiated to the exterior by thermal conduction. However, when an organic substance such as an organic flux used in the step of sealing the package by, for example, a solder remains and attaches to the boundary between the package and the heat radiating member, the heat conduction resistance at the boundary becomes excessively large, resulting in the problem that the effect of heat radiation is greatly decreased.

Therefore, it is an object of the present invention to provide a circuit board in which a thin layer of a high polymer material in a plating region and a cutting region of a metal pattern can be easily and accurately removed so as to improve both the plating property; and the cutting property i.e. to ease in cutting a region to be cut.

Another object of the present invention is to provide a sealing structure in which the heat conduction resistance at the boundary between a heat radiating member and a package can be greatly decreased so that the effect of heat radiation can be satisfactorily achieved.

According to one aspect of the present invention, a circuit board is manufactured by a method comprising the steps of depositing a metal pattern on a surface of a board of a ceramic material, depositing a thin layer of a high polymer material on the surface of the ceramic board formed with the metal pattern, depositing a protective layer of a high polymer material on the surface of the thin layer of the high polymer material, and directing a laser beam toward and onto part of the protective layer and the thin layer deposited on at least one of a plating region of the metal pattern and a cutting region of the ceramic board so as to remove that part of the layer.

According to another aspect of the present invention, an integrated circuit sealing structure comprises a package hermetically enclosing therein a semiconductor integrated circuit element having a desired function, and a heat radiating member brought into contact with the outer surface of the package so as to externally radiate heat generated from the semiconductor integrated circuit element during operation, no foreign matter including an organic substance being substantially present between the contact part of the package and that of the heat radiating member. Prior to assembling the package and the heat radiating member, a laser beam is directed toward and onto at least one of the contact part of the package and that of the heat radiating member, thereby cleaning the irradiated contact part.

In the circuit board manufacturing method according to the present invention, the region where the thin layer of the high polymer material is to be removed, is irradiated with the laser beam for removing the thin layer of the high polymer material from that region. When the high polymer material is irradiated with the laser beam, the molecular bond between C (carbon) and H (hydrogen) and that between C and O (oxygen) forming the high polymer are broken by the phenomenon known as "photo ablation," thereby liberating carbon. However, this liberated carbon accumulates on the protective layer overlaid on the thin layer of the high polymer material and does not accumulate on the metal pattern. The carbon accumulating on the protective layer is removed, together with foreign matter accumulating also on the protective layer, by the later step of removing the protective layer. Because the later etching is achieved by projection of the laser beam, the mask of aluminum required hitherto in the case of the dry etching is unnecessary. Instead aperture having a desired pattern is provided on the side of the laser projection system.

The particulars of the laser beam irradiating the region where the thin layer of the high polymer material is to be removed are preferably such that its wavelength ranges from 150 nm to 400 nm, its energy density ranges from 0.5 $J/cm^2$ to 5.0 $J/cm^2$, and its pulse width ranges from 100 ps to 1 $\mu$s. When the particulars of the laser beam are selected as described above, the thin layer of the high polymer material can be easily and accurately removed without giving rise to undesirable degradation of the plating property or the cutting property attributable to damage or oxidization of the exposed underlying metal pattern. The circuit board thus obtained is highly satisfactory in both the plating property and the cutting property.

Further, in the sealing structure according to the present invention, a flux and other organic substances attaching to the contact surfaces of both the package and the heat radiating member can be completely decomposed and removed by the irradiation with the laser beam, and these contact surfaces can be satisfactorily cleaned. Therefore, an undesirable increase in the heat conduction resistance attributable to the presence of the organic substances at the boundary between the package and the heat radiating member can be avoided, so that the heat radiating member can satisfactorily exhibit the desired effect of heat radiation.

DESCRIPTION OF THE PREFERRED EMBODIMENTS

An embodiment of the circuit board according to the present invention will now be described in detail with reference to FIGS. 1 to 4.

Figure 2:
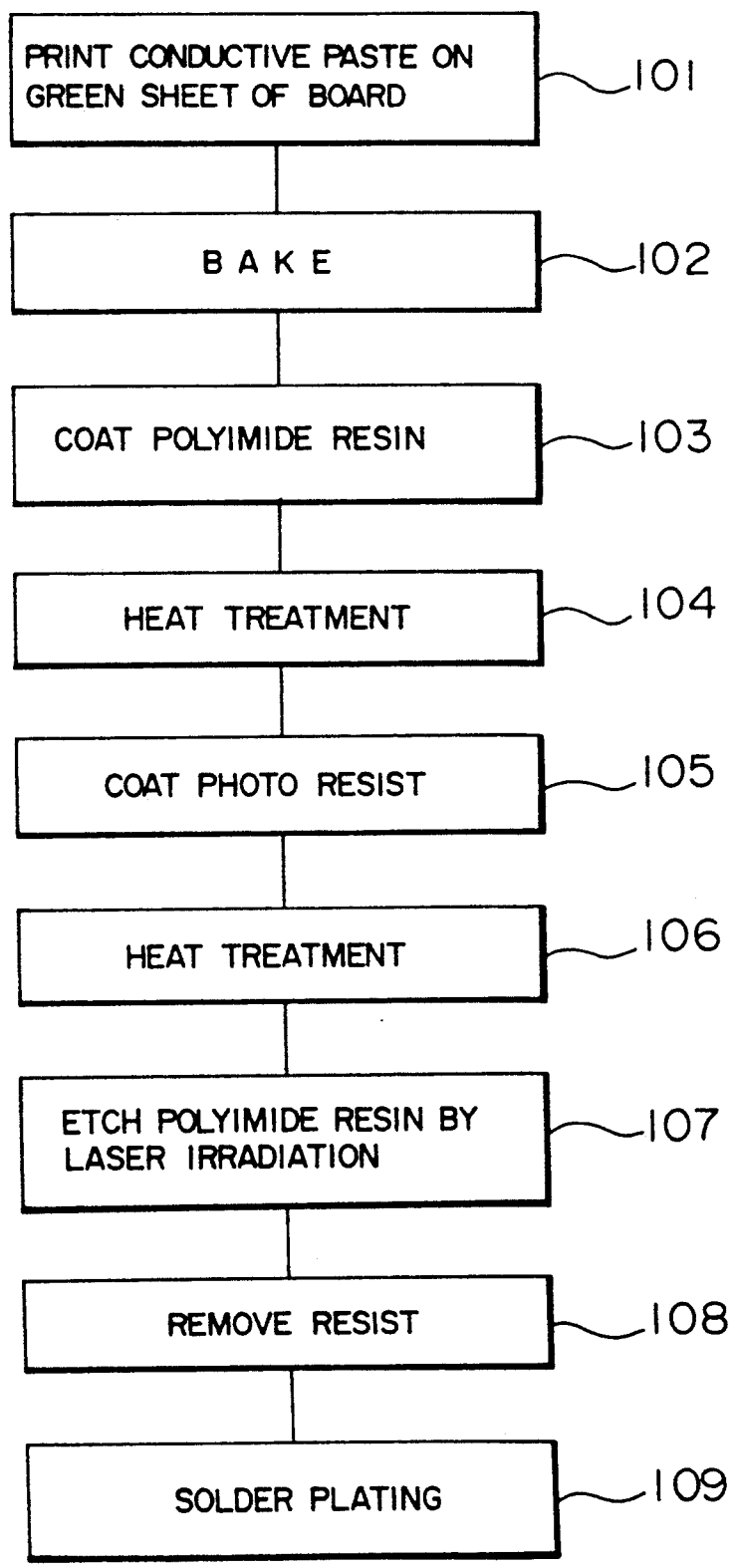
FIG. 2 is one form of a flow chart of the steps in the method for manufacturing the circuit board of the present invention.
Figure 3:
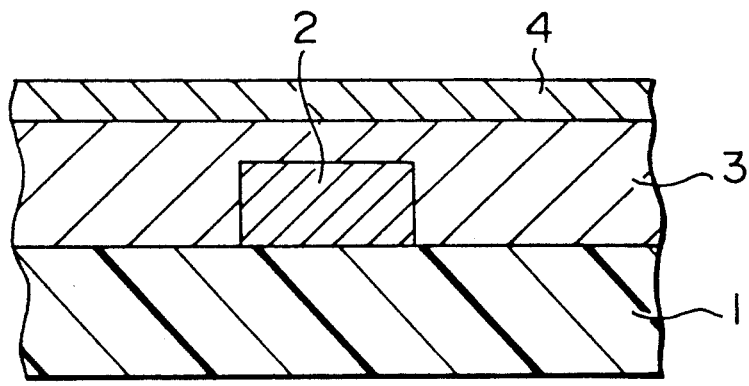
FIG. 3 is a schematic sectional view showing one step in the method for manufacturing the circuit board of the present invention.

Referring first to FIGS. 2 and 3, a conductive metal paste containing a metal having a high melting temperature such as tungsten (W) or molybdenum (Mo) is deposited in a desired pattern by means of, for example, printing on a green sheet of a ceramic material in step 101, and, then, in step 102, the green sheet having the metal paste printed thereon is baked.

As a result of the baking, both the green sheet and the metal paste are thermally set to provide a metal pattern 2 deposited on a ceramic board 1 having a high hardness and a high mechanical strength, as shown in FIG. 3.

Then, in step 103, a high polymer material such as a polyimide resin in liquid form is coated by a method such as spin-coating on the ceramic board 1 so as to cover the entire surface of the ceramic board 1 formed with the metal pattern 2. Then, in step 104, the above structure is heated at a required temperature to thermally set the high polymer resin thereby forming a thin film or layer 3 of the high polymer material as shown in FIG. 3.

It is apparent that a plurality of such metal patterns and a plurality of such high polymer material layers may be further alternately deposited on the high polymer material layer 3 thus formed so as to form a multilayer interconnection wiring arrangement. However, such a multilayer interconnection wiring arrangement is not specifically illustrated for simplicity of the description.

Then, in step 105, a solution of a photo resist material is coated by, for example, the method of spin-coating on the high polymer material layer 3 covering the entire surface of the ceramic board 1 in the state shown in FIG. 3. Then, in step 106, the ceramic board 1 having the resist solution coated on the high polymer material layer 3 is heated at a predetermined temperature so as to thermally set the resist solution thereby forming a resist film or layer 4. FIG. 3 shows that the resist layer 4 is formed on the high polymer material layer 3.

In a later step of selective removal of the high polymer material layer 3, this resist layer 4 acts to protect the remaining region of the high polymer material layer 3 from being adversely affected by foreign matter including carbon produced as a result of the selective removal of the high polymer material layer 3. This resist layer 4 acts also to protect the remaining region of the high polymer material layer 3 from fragments produced during a later step of cutting the ceramic board 1.

Figure 1:
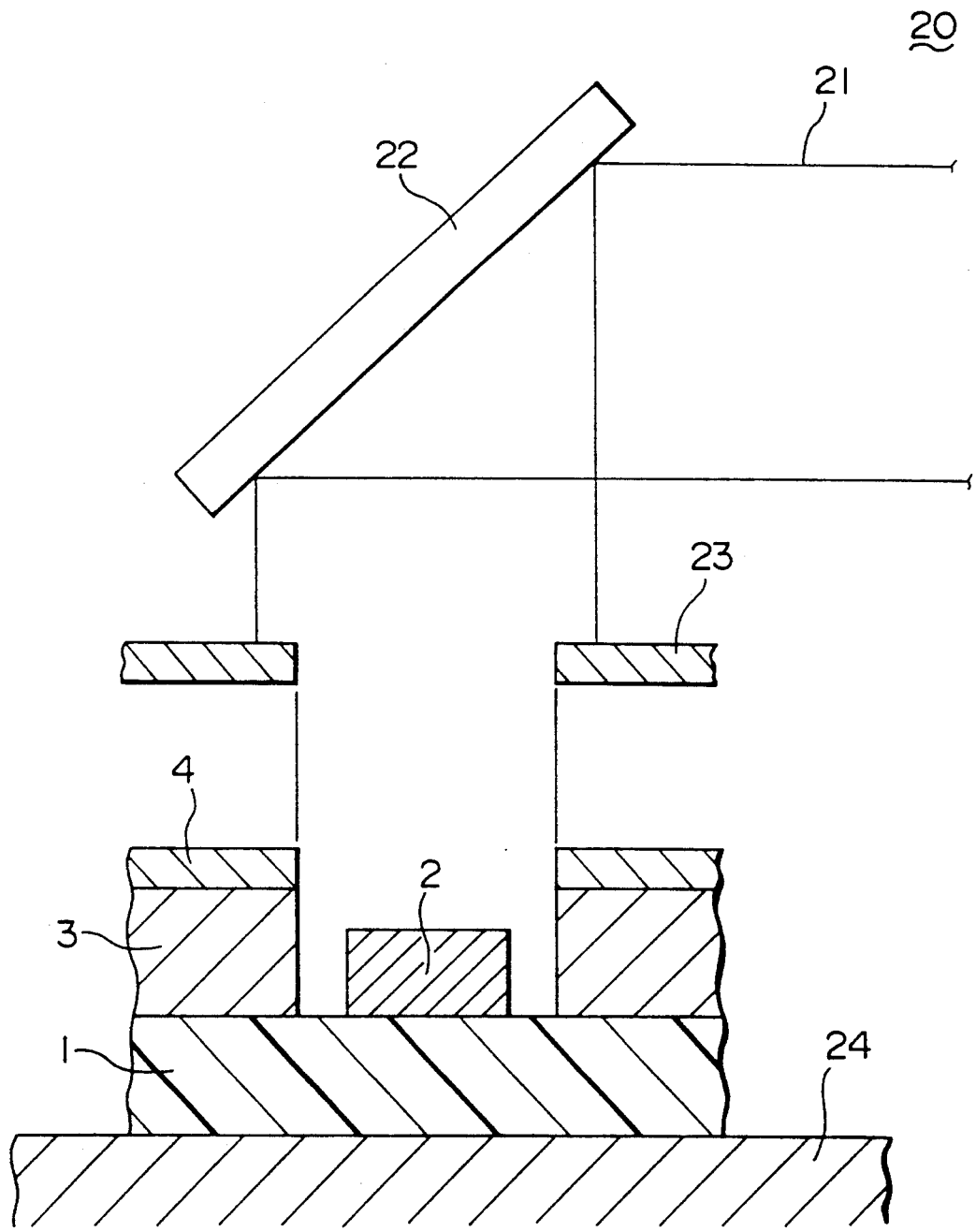
FIG. 1 schematically illustrates a method for manufacturing an embodiment of the circuit board according to the present invention.

Then, in step 107, the high polymer material layer 3 covering the entire surface of the metal pattern 2 deposited on the ceramic board 1 is selectively removed by a laser irradiation device 20 having an arrangement as shown in FIG. 1.

Referring to FIG. 1, one form of the laser irradiation device 20 used in the illustrated embodiment includes a laser source (not shown) emitting a laser beam 21, an optical system including a reflector 22 guiding the laser beam 21 so that the laser beam 21 is incident in substantially perpendicular relation on the surface of the ceramic board 1, a mask 23 of a metal material passing the laser beam 21 so that the laser beam 21 irradiating the surface of the ceramic board 1 has a desired sectional shape, and a positioning stage 24 on which the ceramic board 1 is placed and which is movable relative to the laser source so that the laser beam 21 of the desired shape passed through the mask 23 irradiates the desired region of the ceramic board 1.

By a suitable combination of the movement of the stage 24 relative to the laser source and on-off control of emission of the laser beam 21 from the laser source, the high polymer material layer 3 covering the desired region of the metal pattern 2 is selectively removed by the energy of the laser beam 21, so that soldering can be applied later for the purpose of mounting an electronic part (not shown) or desired plating can be applied later for the purpose of securing a sealing cap by soldering.

That is, in the region of the high polymer material layer 3 irradiated with the laser beam 21, the bond between the molecules of the high polymer material is broken by, for example, the photochemical reaction, and since the liberated individual molecules have a large amount of energy, the part of the high polymer material layer 3 in the region irradiated with the laser beam 21 is instantaneously decomposed into carbon, etc. which are scattered, with the result that this part of the high polymer material layer 3 disappears from the laser irradiated region.

At this time, the foreign matter including carbon scattered in the selective removal step attaches to the resist layer 4 covering the high polymer material layer 3. Thus, there is no possibility that the foreign matter contaminates the high polymer material layer 3 by directly adhering to the remaining part of the high polymer material layer 3.

Further, because that part of the high polymer material layer 3 is removed by the instantaneous application of the high energy, the part of the high polymer material layer 3 in the region irradiated with the laser beam 21 can be completely removed without leaving any residue of the high polymer material, and the surface of the underlying metal pattern 2 is not subjected to undesirable oxidization or damage.

The photo ablation of a high polymer material by irradiation with a laser beam is described in detail in, for example, "EXCIMER LASERS: AN EMERGING TECHNOLOGY IN MATERIALS PROCESSING", LASER FOCUS/ELECTRO-OPTICS, page 54, 56, 58, 60 and 63, May, 1987.

In the illustrated embodiment, an excimer laser is used as the laser source emitting the laser beam 21 having a wavelength of, for example, 308 nm, so that the energy of the laser beam 21 is sufficiently high for breaking the bond between the molecules of the high polymer material layer 3.

Optimum values of the wavelength and power (the energy density) of the laser beam 21 are determined depending on, for example, the material and thickness of the metal pattern 2, those of the ceramic board 1 and the shape of the metal pattern 2. According to the results of research conducted by the inventors, the wavelength range of from 150 nm to 400 nm and the energy density range of from 0.5 J/cm$^2$ to 5.0 J/cm$^2$ were found most preferable. The pulse width of the laser beam 21 preferably lies within the range of from 100 ps to 1 $\mu$s.

That is, when the energy of the laser beam 21 is excessively high, both the metal pattern 2 and the ceramic board 1 will be damaged, and the surface plating property will be degraded. On the other hand, when the energy of the laser beam 21 is excessively low, the high polymer material will leave a residue.

Figure 4:
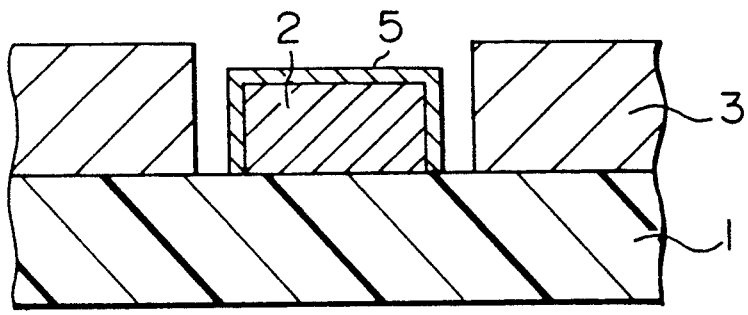
FIG. 4 is a schematic sectional view showing another step in the method for manufacturing the circuit board of the present invention.

After selectively removing the high polymer material layer 3 thereby exposing the desired region of the underlying metal pattern 2 in step 107, the resist layer 4 protecting the high polymer material layer 3 from the foreign matter produced as a result of irradiation with the laser beam 21 as described above is removed in step 108, and then, in step 109, a layer 5 of, for example, gold (Au) is plated on the exposed metal pattern 2, as shown in FIG. 4, for the purpose of improving the wettability for or affinity with a solder which is applied later.

As described already, prior to the deposition of the plated layer 5, the surface of the plating region of the metal pattern 2 is neither oxidized nor damaged during the step of selective removal of the high polymer material layer 3, and no residue of the high polymer material is present on the surface of the plating region of the metal pattern 2. Therefore, the surface of the plating region of the metal pattern 2 is sufficiently flat and shows a satisfactory wettability for the plated layer 5, and there is no possibility of occurrence of a defect or the like on the plated layer 5 due to the presence of contaminating foreign matter and also due to surface irregularity.

Thus, in a later step of soldering an electronic part (not shown) on the metal pattern 2, a bond having sufficient mechanical strength can be achieved.

Further, because the foreign matter that may be produced during irradiation with the laser beam 21 and attach to the surface of the resist layer 4 is removed when the resist layer 4 is removed, the metal pattern 2 is not contaminated and is kept clean.

Figure 5:
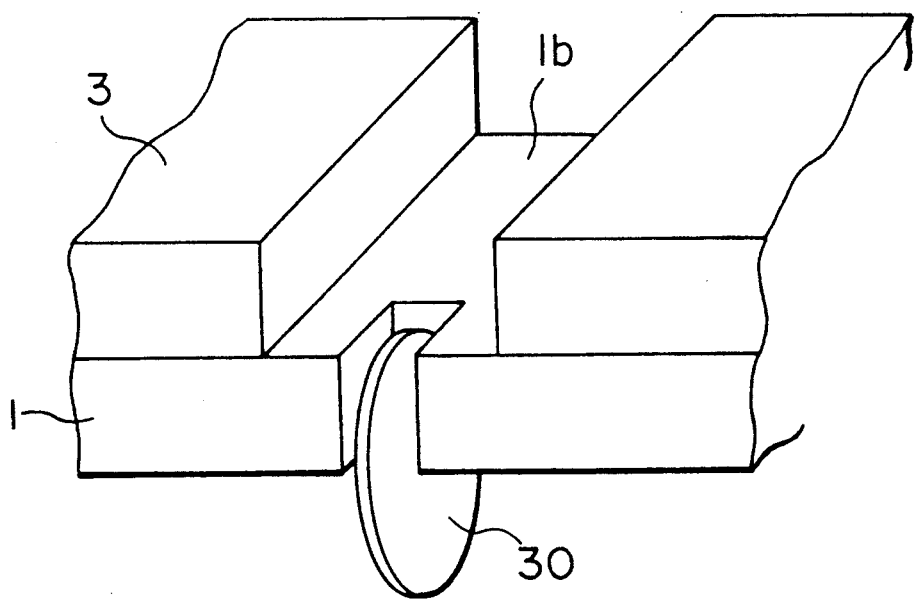
FIG. 5 is a schematic perspective view showing a cutting step in a method for manufacturing another embodiment of the circuit board of the present invention.

FIG. 5 is a schematic perspective view showing a cutting step in a method for manufacturing another embodiment of the circuit board of the present invention, and, in FIG. 5, like reference numerals are used to designate like parts appearing in FIG. 1.

In the second embodiment of the circuit board, a high polymer material layer 3 is similarly deposited to cover a ceramic board 1, and part of the high polymer material layer 3 covering a cutting region 1b of the ceramic board 1 is selectively removed by laser beam irradiation as in the case of the first embodiment. Then, the ceramic board 1 is cut at the cutting region 1b by the grinding action of a dicer blade 30 rotating at a high speed.

Thus, the dicer blade 30 is not subjected to clogging of the gaps between its grains due to the presence of fragments of the high polymer material layer 3 left in the cutting region of the ceramic board 1. Therefore, the dicer blade 30 can efficiently cut the circuit board 1 without being obstructed in its cutting operation and without being shortened in its useful service life.

Figure 6A:
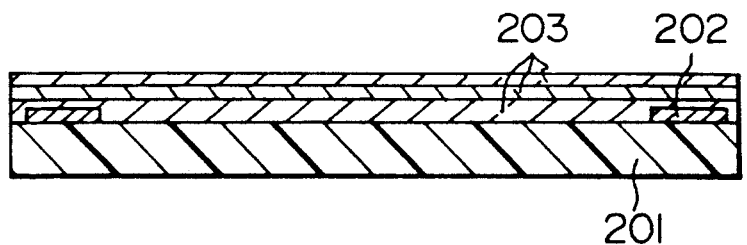
FIGS. 6A, 6B and 6C are schematic sectional views showing in sequential order the steps of a method for manufacturing an embodiment of the integrated circuit sealing structure according to the present invention.
Figure 6B:
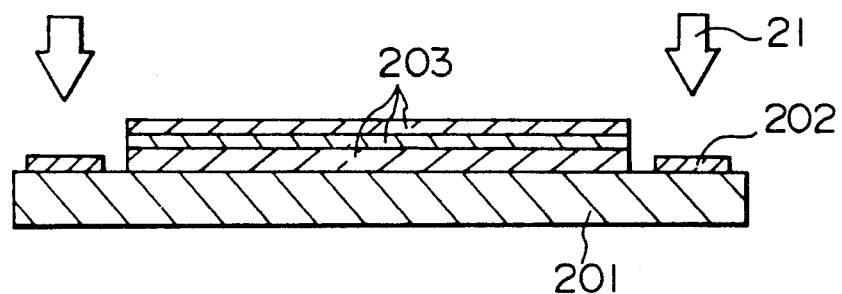
Figure 6C:
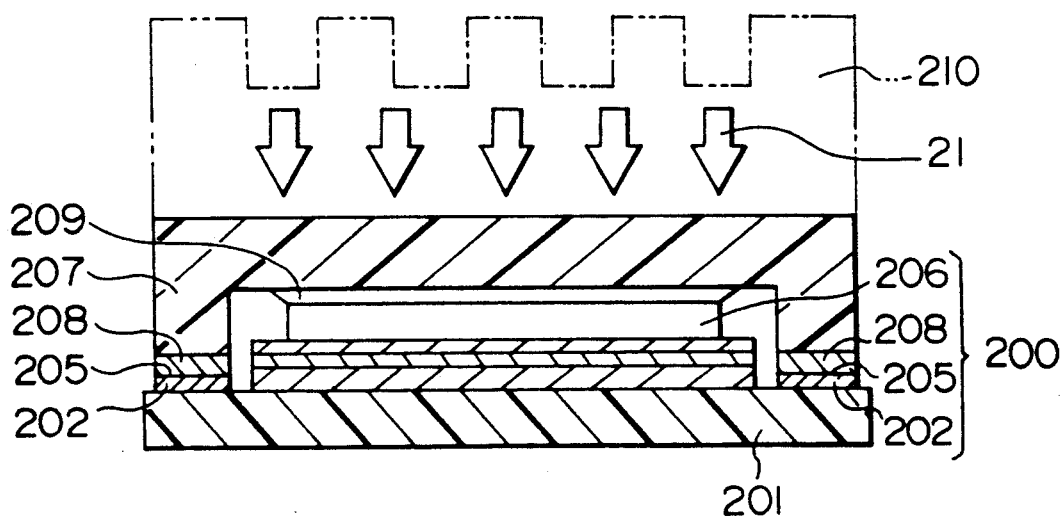

FIGS. 6A, 6B and 6C are schematic sectional views showing in sequential order the steps of a method for manufacturing an embodiment of the integrated circuit sealing structure according to the present invention.

In this embodiment, a package base 201 is formed of, for example, a ceramic material similar to that forming the aforementioned circuit board, and a plurality of high polymer material layers 203 and a plurality of metal patterns (not shown) are alternately laminated on the package base 201 as shown in FIG. 6A so as to form a multilayer interconnection wiring arrangement (not shown). Also, as shown in FIG. 6A, a metallized pattern 202 in the form of a desired metal pattern is formed so as to surround the multilayer interconnection wiring arrangement. The wiring on the uppermost high polymer material layer 203 is formed with electrodes to be bonded to a semiconductor integrated circuit element 206.

Then, as shown in FIG. 6B, the laser beam 21 from the aforementioned laser irradiation device 20 is directed so as to selectively remove the high polymer material layers 203 covering the metallized pattern 202 as well as connection electrodes (not shown) disposed inside relative to the metallized pattern 202 and also to selectively remove, when required, the high polymer material layer 203 covering the outside relative to the metallized pattern 202. A plurality of such package bases 201 are usually obtained by cutting a single ceramic board. In this case too, the high polymer material layers 203 covering the cutting regions between the individual package bases 201 ar also selectively removed by the irradiation with the laser beam 21, as shown in FIG. 6B.

Then, the semiconductor integrated circuit element 206 is bonded to the connection electrodes (not shown) in the multilayer interconnection wiring arrangement (not shown) formed on the central area of the package base 201, and, after plating a layer 205 of a metal such as gold (Au) on the metallized pattern 202, a sealing cap 207 of, for example, a ceramic material is secured to the package base 201 through a solder layer 208.

On the sealing portion of the cap 207, too, a metallized pattern and a plating layer similar to those provided on the package base 201 are also provided. However, they are not illustrated for simplicity of the description.

The semiconductor integrated circuit element 206 disposed inside the package is connected at its entire back surface to the inner wall of the cap 207 through a solder layer 209, so that heat generated during operation of the semiconductor integrated circuit element 206 can be radiated toward the cap 207.

By securing or sealing the sealing cap 207 to the package base 201 in the manner described above, an integrated circuit sealing structure 200 is formed in which the semiconductor integrated circuit element 206 having a required function is hermetically enclosed as shown in FIG. 6C.

A heat radiating member 210 is then brought into contact with the back surface of the cap 207 in the integrated circuit sealing structure 200, so that heat generated from the semiconductor integrated circuit element 206 enclosed in the sealing structure 200 is radiated toward the exterior by conducting through the solder layer 209, the cap 207 and the heat radiating member 210.

After the cap 207 is secured to the package base 201 in the embodiment of the sealing structure according to the present invention, the laser beam 21 is directed toward and onto the contact surfaces of both the package base 201 and the heat radiating member 210 so as to remove foreign matter including any organic substance remaining on the contact surfaces thereby cleaning such surfaces.

When an organic substance such as part of a flux used for securing the cap 207 to the package base 201 by the solder layers 208 and 209 remains on the contact surface of the cap 207 in contact with the heat radiating member 210, the heat conduction resistance between the cap 207 and the heat radiating member 210 will increase, and the desired effect of heat radiation by the heat radiating member 210 will not be achieved. In the illustrated embodiment, the laser beam 21 is directed toward the contact surfaces of both the cap 207 and the package base 201 so as to completely remove such an organic substance existing between them, so that the desired effect of heat radiation through the cap 207 and the heat radiating member 210 can be reliably achieved.

Consequently, the reliability of operation of the semiconductor integrated circuit element 206 can be improved.

The particulars of the laser beam 21 used in the embodiment shown in FIGS. 6A to 6C are the same as those of the laser beam 21 used in the embodiment shown in FIG. 1. Any suitable laser source can be used, provided that these particulars are satisfied. For example, any one of an excimer laser, a YAG laser and other suitable lasers can be used.

While preferred embodiments of the present invention have been described in detail, it is apparent that the present invention is in no way limited to such specific embodiments, and various changes and modifications may be made without departing from the subject matter of the present invention.

Some of the advantages of the present invention will now be summarized as follows.

The circuit board according to the present invention is manufactured by a method comprising at least the steps of depositing a metal pattern on a board of a ceramic material, depositing a thin layer of a high polymer material on the ceramic board formed with the metal pattern, depositing a protective layer of a high polymer material on the thin layer of the high polymer material, and directing a laser beam toward and onto the protective layer and the thin layer deposited on at least one of a plating region of the metal pattern and a cutting region of the ceramic board to remove that part of the layer. The part of the thin layer of the high polymer material to be selectively removed is irradiated with a laser beam whose particulars are preferably such that the wavelength ranges from 150 nm to 400 nm, the energy density ranges from 0.5 J/cm$^2$ to 5.0 J/cm$^2$, and the pulse width ranges from 100 ps to 1 $\mu$s. By so selecting the particulars of the irradiating laser beam, the thin layer of the high polymer material can be easily and accurately selectively removed without degradation of the plating property attributable to, for example, damage and oxidization of the exposed underlying metal pattern, so that the circuit board thus obtained is satisfactory in both the plating property and the cutting property.

Also, the integrated circuit sealing structure according to the present invention comprises a package hermetically enclosing therein a semiconductor integrated circuit element having a desired function, and a heat radiating member brought into contact with the outer surface of the package so as to externally radiate heat generated from the semiconductor integrated circuit element during operation. Prior to assembling the package and the heat radiating member, a laser beam is directed toward and onto at least one of the contact part of the package and that of the heat radiating member thereby cleaning the contact part. Therefore, foreign matter including an organic substance such as a flux attaching to the boundary between the package and the heat radiating member can be completely removed because the foreign matter can be completely decomposed when irradiated with the laser beam. Therefore, an undesirable increase in the heat conduction resistance at the boundary between the package and the heat radiating member due to the presence of such an organic substance can be avoided, so that the heat radiating member can satisfactorily exhibit the desired effect of heat radiation.

We claim:

1. A method for manufacturing a circuit board, comprising the steps of:
   depositing a metal pattern on a surface of a board of a ceramic material;
   depositing a thin layer of a high polymer material on the surface of said ceramic board formed with said metal pattern;
   depositing a protective layer on the surface of said thin layer of the high polymer material;
   directing a laser beam toward and onto part of said thin layer deposited on a plating region of said metal pattern to remove said part of said thin layer; and
   removing said protective layer.

2. A circuit board manufacturing method according to claim 1, wherein said laser beam has a wavelength within the range of from 150 nm to 400 nm.

3. A circuit board manufacturing method according to claim 2, wherein said laser beam has an energy density within the range of from 0.5 J/cm$^2$ to 5.0 J/cm$^2$.

4. A circuit board manufacturing method according to claim 3, wherein said laser beam has a pulse width within the range of from 100 ps to 1 $\mu$s.

5. A circuit board manufacturing method according to claim 1, wherein said laser beam has an energy density within the range of from 0.5 J/cm$^2$ to 5.0 J/cm$^2$.

6. A circuit board manufacturing method according to claim 5, wherein said laser beam has a pulse width within the range of from 100 ps to 1 $\mu$s.

7. A circuit board manufacturing method according to claim 1, wherein said laser beam has a pulse width within the range of from 100 ps to 1 $\mu$s.

8. An integrated circuit sealing structure according to claim 1, wherein the protective layer includes a high polymer material.

9. A method for manufacturing a circuit board, comprising the steps of:
   depositing a thin layer of a high polymer material on a surface of a ceramic board;
   depositing a protective layer on the surface of said thin layer of the high polymer material;
   directing a laser beam toward and onto part of said thin layer deposited on a cutting region of said ceramic board to remove said part of said thin layer; and
   removing said protective layer.

10. A circuit board manufacturing method according to claim 9, wherein said laser beam has a wavelength within the range of from 150 nm to 400 nm.

11. A circuit board manufacturing method according to claim 10, wherein said laser beam has an energy density within the range of from 0.5 J/cm$^2$ to 5.0 J/cm$^2$.

12. A circuit board manufacturing method according to claim 11, wherein said laser beam has a pulse width within the range of from 100 ps to 1 $\mu$s.

13. A circuit board manufacturing method according to claim 9, wherein said laser beam has an energy density within the range of from 0.5 J/cm$^2$ to 5.0 J/cm$^2$.

14. A circuit board manufacturing method according to claim 13, wherein said laser beam has a pulse width within the range of from 100 ps to 1 $\mu$s.

15. A circuit board manufacturing method according to claim 9, wherein said laser beam has a pulse width within the range of from 100 ps to 1 $\mu$s.

16. A method for manufacturing a circuit board as claimed in claim 9, wherein the protective layer includes a high polymer material.

* * * * *